United States Patent
Matsuzuka et al.

(10) Patent No.: US 8,138,836 B2
(45) Date of Patent: Mar. 20, 2012

(54) EMITTER-FOLLOWER TYPE BIAS CIRCUIT

(75) Inventors: Takayuki Matsuzuka, Tokyo (JP); Kazuya Yamamoto, Tokyo (JP); Tomoyuki Asada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/875,168

(22) Filed: Sep. 3, 2010

(65) Prior Publication Data

US 2011/0187459 A1 Aug. 4, 2011

(30) Foreign Application Priority Data

Feb. 2, 2010 (JP) .................. 2010-021073

(51) Int. Cl.
*H03F 3/16* (2006.01)
(52) U.S. Cl. ........................ 330/296; 330/285
(58) Field of Classification Search .................. 330/285, 330/296, 289, 272–273, 266
See application file for complete search history.

(56) References Cited

U.S. PATENT DOCUMENTS

| | | | |
|---|---|---|---|
| 6,288,613 B1 * | 9/2001 | Bennett | 330/296 |
| 6,937,102 B2 * | 8/2005 | Lopez et al. | 330/296 |
| 6,946,913 B2 | 9/2005 | Moriwaki et al. | |
| 7,522,001 B2 | 4/2009 | Yamamoto et al. | |
| 2009/0174474 A1 | 7/2009 | Matsuzuka et al. | |
| 2010/0127689 A1 | 5/2010 | Yamamoto et al. | |

FOREIGN PATENT DOCUMENTS

| | | |
|---|---|---|
| JP | 10-322193 A | 12/1998 |
| JP | 2004-240822 A | 8/2004 |
| JP | 2004-343244 A | 12/2004 |
| JP | 2009-55096 A | 3/2009 |
| JP | 2009-164930 A | 7/2009 |
| JP | 2010-124408 A | 6/2010 |

* cited by examiner

*Primary Examiner* — Hieu Nguyen
(74) *Attorney, Agent, or Firm* — Leydig, Voit & Mayer, Ltd.

(57) ABSTRACT

An emitter-follower bias circuit supplying a bias voltage to the base of an amplification transistor includes: a depletion mode FET boosting a reference voltage; and an emitter-follower circuit generating the bias voltage in response to the reference voltage boosted by the depletion mode FET.

6 Claims, 15 Drawing Sheets

EMITTER-FOLLOWER TYPE BIAS CIRCUIT

BACKGROUND OF THE INVENTION

1. Field of the Invention

The present invention relates to an emitter-follower type bias circuit supplying a bias voltage to a base of an amplification transistor, and in particular to an emitter-follower type bias circuit which can operate at a low reference voltage.

2. Background Art

Currently, GaAs-HBT power amplifiers are increasingly being used for CDMA-based cellular phones, wireless LAN or the like (e.g., see Japanese Patent Laid-Open No. 2004-343244).

Conventional power amplifiers receive a reference voltage from outside as input. Since the reference voltage determines an idle current of each power amplifier, the reference voltage needs to be kept constant with high accuracy (e.g., on the order of 2.85 V±0.1 V) irrespective of any variation in a power supply voltage. There is a demand in recent years that a reference voltage should be generated inside the power amplifier. In this case, the reference voltage is generated inside the power amplifier in response to an enable signal (a digital signal to turn ON/OFF the power amplifier) given from outside.

Furthermore, there is also a demand in recent years that an enable signal should be generated at a lower voltage. That is, power amplifiers are conventionally operated with an enable signal on the order of 2.6 V, but it is only recently that power amplifiers are required to be operated with an enable signal on the order of 1.4 V.

SUMMARY OF THE INVENTION

When a reference voltage generation circuit using a GaAs-based BiFET (HBT+FET) process is designed such that a reference voltage rises with a low enable signal, the reference voltage outputted by the reference voltage generation circuit is lower. When, for example, the enable signal is on the order of 1.4 V, the reference voltage is on the order of 2 V. However, conventional emitter-follower type bias circuits require a reference voltage of at least on the order of 2.7 V and there is a problem that the bias circuits cannot be driven at such a low reference voltage.

In view of the above-described problems, an object of the present invention is to provide an emitter-follower type bias circuit which can operate at a low reference voltage.

According to the present invention, an emitter-follower type bias circuit supplying a bias voltage to a base of an amplification transistor, comprises: a depletion mode FET boosting a reference voltage; and an emitter-follower circuit generating the bias voltage according to the reference voltage boosted by the depletion mode FET.

The present invention makes it possible to operate at a low reference voltage.

Other and further objects, features and advantages of the invention will appear more fully from the following description.

DETAILED DESCRIPTION OF THE PREFERRED EMBODIMENTS

First Embodiment

Figure 1:
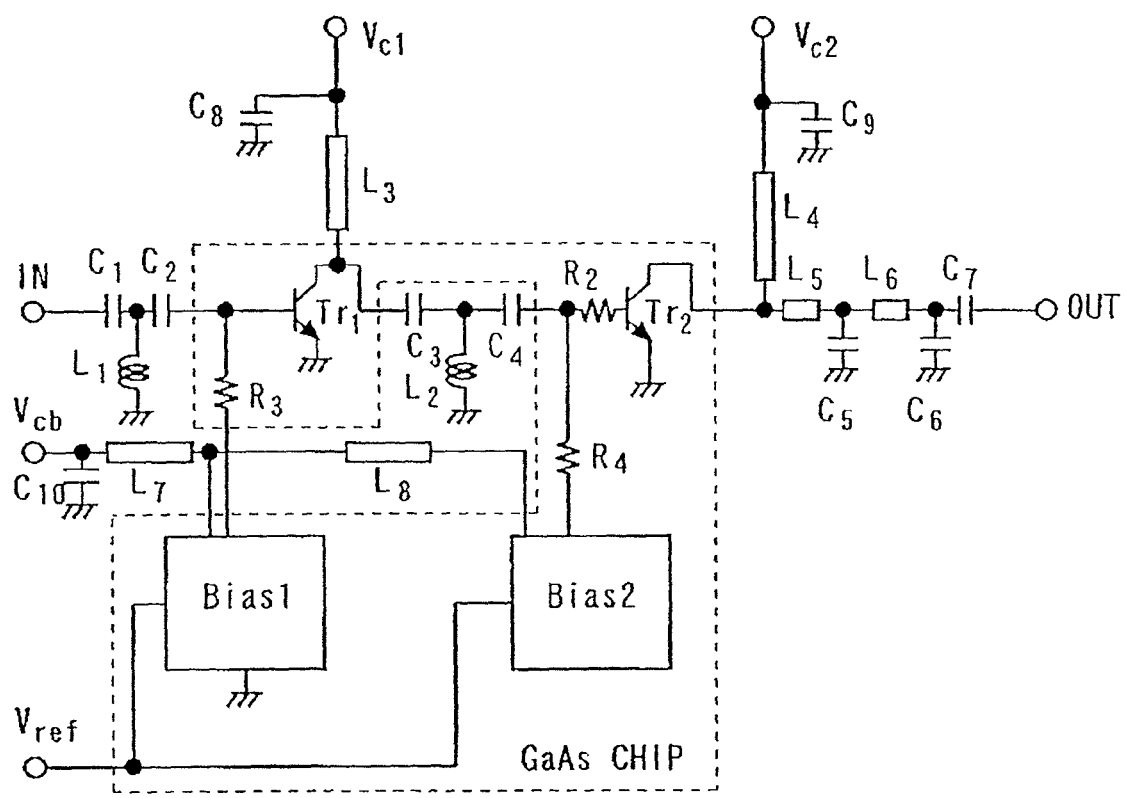
FIG. 1 is a diagram illustrating a power amplifier according to First embodiment.

FIG. 1 is a diagram illustrating a power amplifier according to First embodiment. This power amplifier is a two-stage amplifier formed through a BiFET process whereby an HBT and an FET are formed on the same substrate.

A GaAs chip is shown enclosed by a dotted-line frame and circuit elements outside the dotted-line frame are formed of chip parts and lines on a module substrate. A Tr1 which is a first-stage amplification element that amplifies an input signal and a Tr2 which is a second-stage amplification element that amplifies an output signal of the Tr1 are formed on the same GaAs substrate. The Tr1 and Tr2 are GaAs-HBTs (heterojunction bipolar transistors).

A Bias1 is a first-stage bias circuit that supplies a bias current to the base of the Tr1 and a Bias2 is a second-stage bias circuit that supplies a bias current to the base of the Tr2. An IN is an RF signal input terminal, an OUT is an RF output signal terminal, R2 to R4 are resistors, C1 to C10 are capacitors, and L1 and L2 are inductors. L3 to L8 are lines having specific electric lengths and operate as inductors. A Vc1 is a collector power supply terminal for the Tr1, a Vc2 is a collector power supply terminal for the Tr2, a Vcb is a power supply terminal of the Bias1 and Bias2, and a Vref is a terminal that applies a reference voltage to the Bias1 and Bias2.

The C3, C4 and L2 constitute an inter-section matching circuit connected between the drain of the Tr1 and the base of the Tr2. Recently, the C1, C2 and L1 constituting an input matching circuit, and C3, C4 and L2 constituting the inter-section matching circuit are also often integrated on the GaAs chip to reduce the size of the module.

Figure 2:
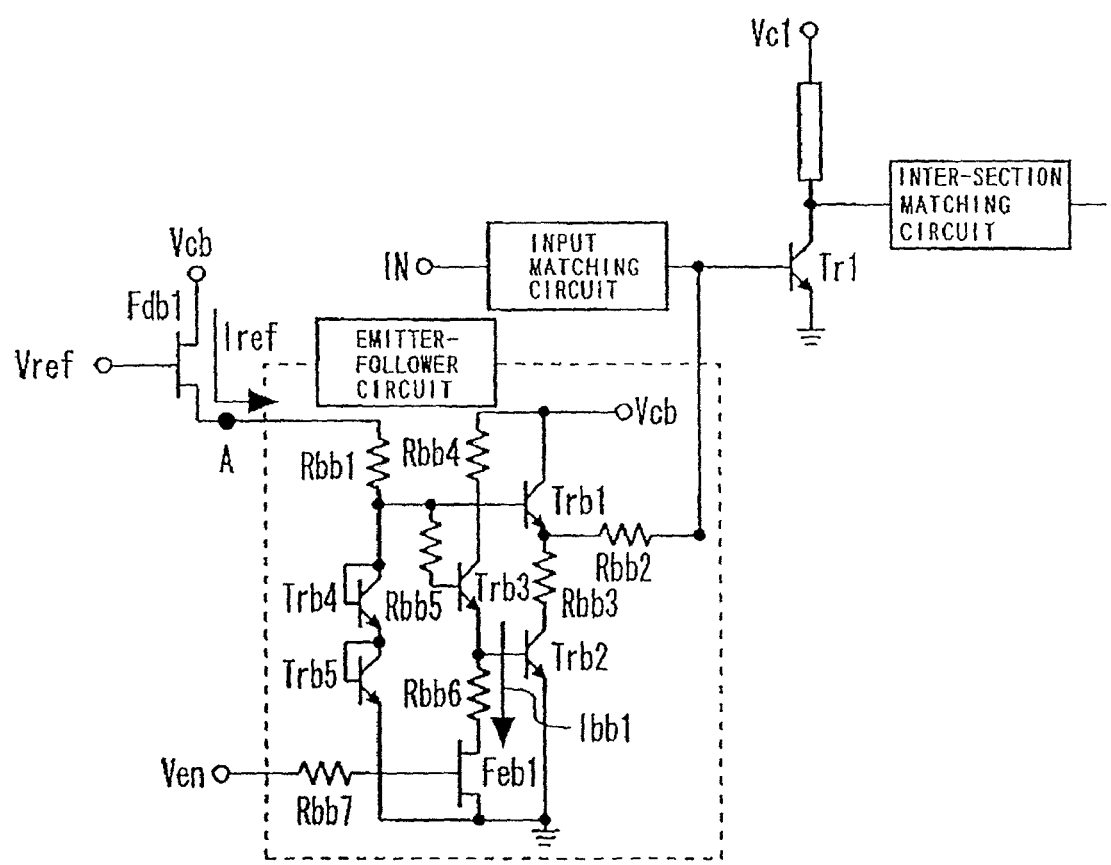
FIG. 2 is a diagram illustrating an emitter-follower type bias circuit according to First embodiment.

FIG. 2 is a diagram illustrating an emitter-follower type bias circuit according to First embodiment. Here, the first-stage bias circuit will be described, but the same will apply to the circuit configuration of the second-stage bias circuit, too.

An Fdb1 is a depletion mode PET, an Feb1 is an enhancement mode FET, Trb1 to Trb5 are GaAs-HBTs, Rbb1 to Rbb7 are resistors and a Ven is a terminal to which an enable signal is inputted.

The drain of the Fdb1 is connected to a power supply terminal Vcb, the gate of the Fdb1 is connected to a terminal Vref. The collector of the Trb1 is connected to the power supply terminal Vcb and the base of the Trb1 is connected to the source of the Fdb1 via the Rbb1 and the emitter of the Trb1 is connected to the base of the Tr1 via the Rbb2. The collector of the Trb2 is connected to the emitter of the Trb1 via the Rbb3 and the emitter of the Trb2 is grounded. The collector of the Trb3 is connected to the power supply terminal Vcb via the Rbb4 and the base of the Trb3 is connected to the base of the Trb1 and the Rbb1 via the Rbb5. The emitter of the Trb3 is connected to the base of the Trb2.

The drain of the Feb1 is connected to the emitter of the Trb3 via the Rbb6, the gate of the Feb1 is connected to the terminal Ven via the Rbb7 and the source of the Feb1 is grounded. The base and collector of the Trb4 are connected to the base of the Trb1 and the Rbb1. The base and collector of the Trb5 are connected to the emitter of the Trb4 and the emitter of the Trb5 is grounded.

The Fdb1 boosts a reference voltage inputted from the terminal Vref. The emitter-follower circuit generates a bias voltage according to the reference voltage boosted by the Fdb1. The emitter-follower circuit operates so that an idle current of the Tr1 (bias current when no RP signal is inputted) is kept constant irrespective of any temperature variation.

Figure 3:
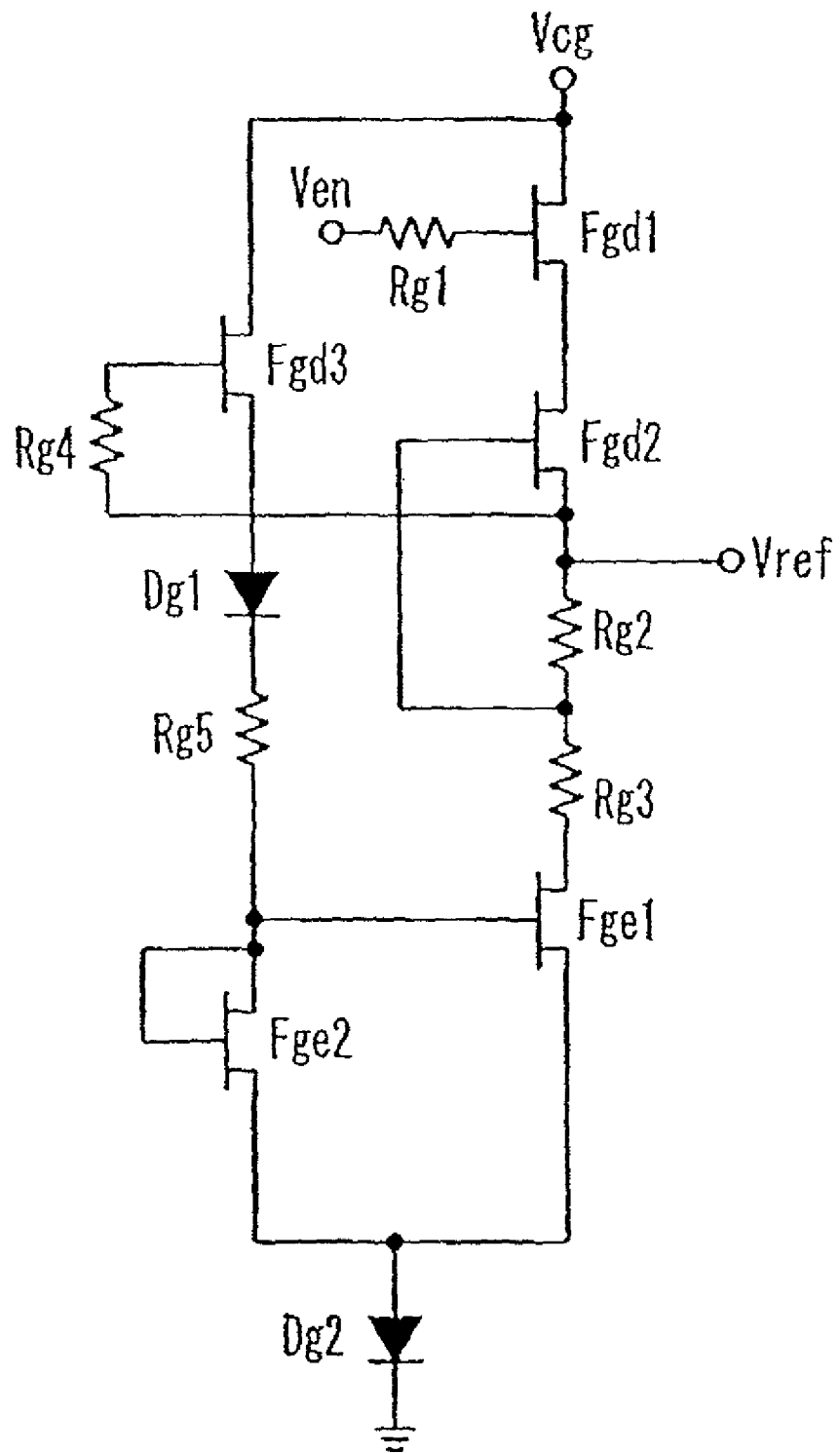
FIG. 3 is a diagram illustrating a reference voltage generation circuit according to First embodiment.

FIG. 3 is a diagram illustrating a reference voltage generation circuit according to First embodiment. This reference voltage generation circuit is integrated on the same GaAs chip as the above described bias circuit using a BiFET process. Furthermore, this reference voltage generation circuit can operate with a low enable signal on the order of 1.4 V.

Fgd1 to Fgd3 are depletion mode FETs, Fge1 and Fge2 are enhancement mode FETs, Rg1 to Rg5 are resistors, Dg1 and Dg2 are Schottky barrier diodes, a Vcg is a terminal to which a power supply voltage (normally on the order of 3.4 V) is applied.

The drain of the Fgd1 is connected to the terminal Vcg and the gate of the Fgd1 is connected to the terminal Ven via the Rg1. The drain of the Fdg2 is connected to the source of the Fgd1, the gate of the Fdg2 is connected to one end of the Rg2 and the source of the Fdg2 is connected to the other end of the Rg2.

The drain of the Fge1 is connected to one end of the Rg2 via the Rg3, the drain of the Fgd3 is connected to the terminal Vcg, the gate of the Fgd3 is connected to the source of the Fgd2 via the Rg4. The source of the Fdg3 is connected to the gate of the Fge1, the drain and gate of the Fge2 via the Dg1 and the Rg5. The source of the Fge1 and the source of the Fge2 are grounded via the Dg2.

In this reference voltage generation circuit, the Fgd1 functions as a switch to turn ON/OFF the reference voltage generation circuit. The source voltage of the Fdg2 is outputted as a reference voltage.

Figure 4:
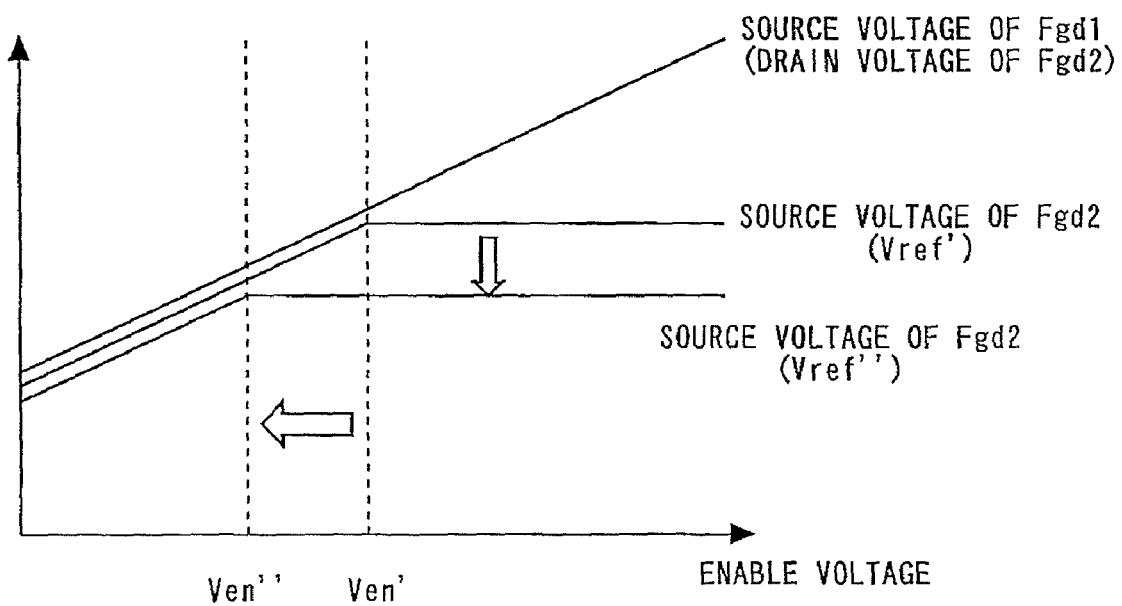
FIG. 4 is a diagram illustrating enable voltage dependency of the reference voltage generated by the reference voltage generation circuit in FIG. 3.

FIG. 4 is a diagram illustrating enable voltage dependency of the reference voltage generated by the reference voltage generation circuit in FIG. 3. A Ven' represents a minimum enable voltage to output a desired reference voltage Vref'.

Since the source voltage of the Fgd1 (drain voltage of the Fgd2) changes with the enable voltage, the source voltage (reference voltage) of the Fgd2 is limited by the enable voltage in a low enable voltage region. Therefore, when the reference voltage is made to rise at a lower enable voltage Ven" (Ven'→Ve"), the reference voltage is lowered (Vref'→Vref"). When, for example, the circuit is made to operate at an enable voltage on the order of 1.4 V, the reference voltage is approximately on the order of 2 V. However, a reference voltage of at least on the order of 2.7 V is necessary to drive the conventional emitter-follower type bias circuit. Therefore, the reference voltage generation circuit in FIG. 3 cannot drive the conventional emitter-follower type bias circuit.

By contrast, the emitter-follower type bias circuit in FIG. 2 can be driven even by the reference voltage generation circuit in FIG. 3. Hereinafter, the operation of the emitter-follower type bias circuit in FIG. 2 will be described.

The reference voltage generated by the reference voltage generation circuit in FIG. 3 is inputted to the gate of the Fdb1. The gate-source voltage of the Fdb1 is determined according to a current Iref that flows into the emitter-follower circuit. Since the Fdb1 is a depletion mode FET, the source has a higher voltage than the gate. When, for example, a threshold voltage is on the order of −0.9 V, the voltage at point A is higher than the gate voltage (reference voltage) of the Fdb1 by on the order of 0.8 V.

When the reference voltage generated by the reference voltage generation circuit in FIG. 3 is assumed to be on the order of 2 V, the voltage inputted to the emitter-follower circuit (voltage at point A) is on the order of 2.8 V and can drive the emitter-follower circuit. Thus, the Fdb1 plays a role of boosting the reference voltage. Therefore, the emitter-follower type bias circuit according to the present embodiment can operate at a lower reference voltage than the conventional one. That is, the emitter-follower type bias circuit can be combined with the reference voltage generation circuit in FIG. 3 that can operate with a low enable signal.

Furthermore, when the enable voltage is 0 V (shut down state), the output voltage (reference voltage) of the reference voltage generation circuit does not become 0 V and a residual voltage of a little less than 1 V is generated. The emitter-follower type bias circuit does not normally operate at this reference voltage. However, if no Feb1 exists, a minimal leakage current Ibb1 is generated. The Feb1 turns ON when the enable voltage is higher than a threshold voltage of the Feb1 (during operation) and turns OFF when the enable voltage is lower than the threshold voltage of the Feb1 (at the time of shut down), and can thereby suppress leakage current.

Second Embodiment

An emitter-follower type bias circuit according to Second embodiment will be described with reference to the attached drawing. Components similar to or corresponding to those in First embodiment will be assigned the same reference numerals and descriptions thereof will be omitted.

Figure 5:
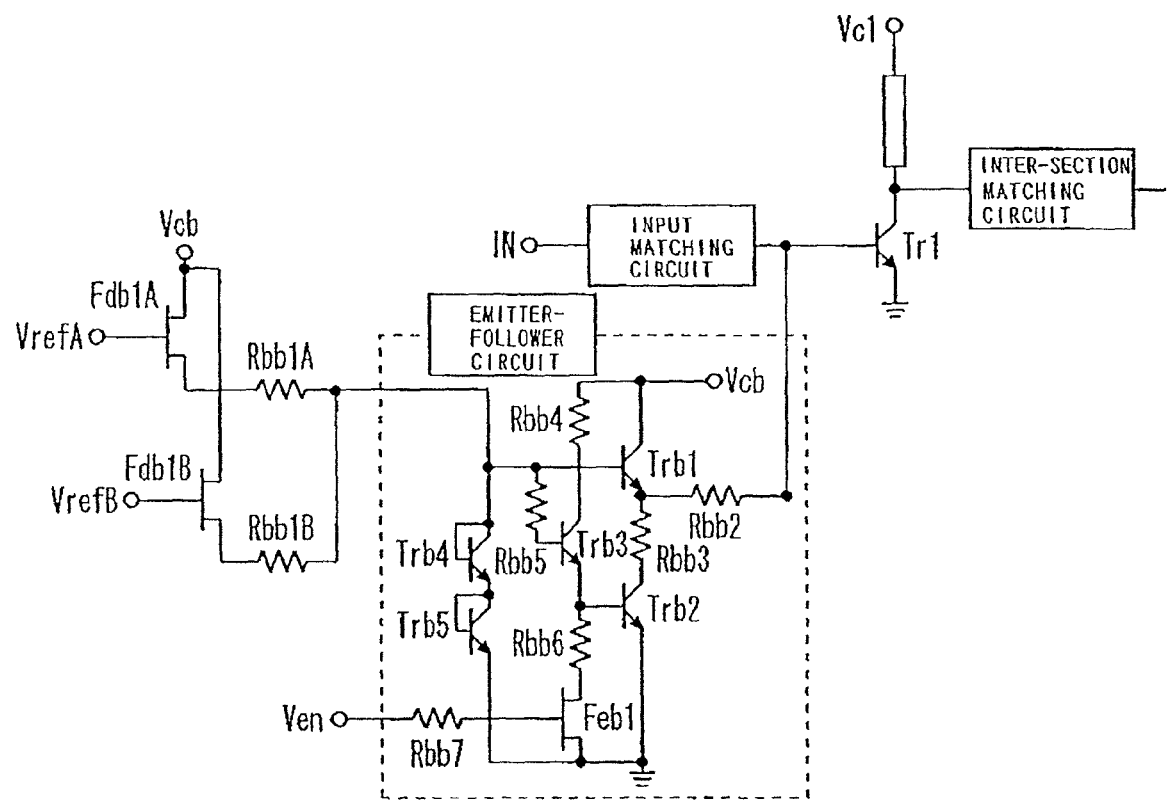
FIG. 5 is a diagram illustrating the emitter-follower type bias circuit according to Second embodiment.

FIG. 5 is a diagram illustrating the emitter-follower type bias circuit according to Second embodiment. Fdb1A and Fdb1B are depletion mode FETs, VrefA and VrefB are terminals to which reference voltages are applied and Rbb1A and Rbb1B are resistors. Unlike First embodiment, the bias circuit according to the present embodiment has two reference voltage input systems.

The Rbb1A and Rbb1B have different resistance values and, for example, the resistance value of the Rbb1B is greater than the resistance value of the Rbb1A. Complementary reference voltages are inputted to the terminal VrefA and the terminal VrefB. The Fdb1A boosts a first reference voltage inputted from the terminal VrefA. The Fdb1B boosts a second reference voltage inputted from the terminal VrefB. The boosted first reference voltage is inputted to the emitter-follower circuit via the Rbb1A and the boosted second reference voltage is inputted to the emitter-follower circuit via the Rbb1B.

When a high level reference voltage is inputted to the terminal VrefA and a low level reference voltage (=0 V) is inputted to the terminal VrefB, the Fdb1 operates and the Fdb2 turns OFF, and therefore the resistor corresponding to the Rbb1 of First embodiment is the Rbb1A (small resistance value). On the other hand, when a low level reference voltage (=0 V) is inputted to the terminal VrefA and a high level reference voltage is inputted to the terminal VrefB, the Fdb1 turns OFF and the Fdb2 operates, and therefore the resistor corresponding to the Rbb1 of First embodiment is the Rbb1B (large resistance value).

In the present embodiment, any one of the Rbb1A and Rbb1B of different resistance values can be selected and therefore the idle current of the Tr1 can be changed. Although the present embodiment assumes that the same high level voltage is inputted to the terminal VrefA and the terminal VrefB, an equivalent effect can also be obtained even when different high level voltages are inputted.

Third Embodiment

An emitter-follower type bias circuit according to Third embodiment will be described with reference to the attached drawings. Components similar to or corresponding to those in first and second embodiments will be assigned the same reference numerals and descriptions thereof will be omitted.

Figure 6:
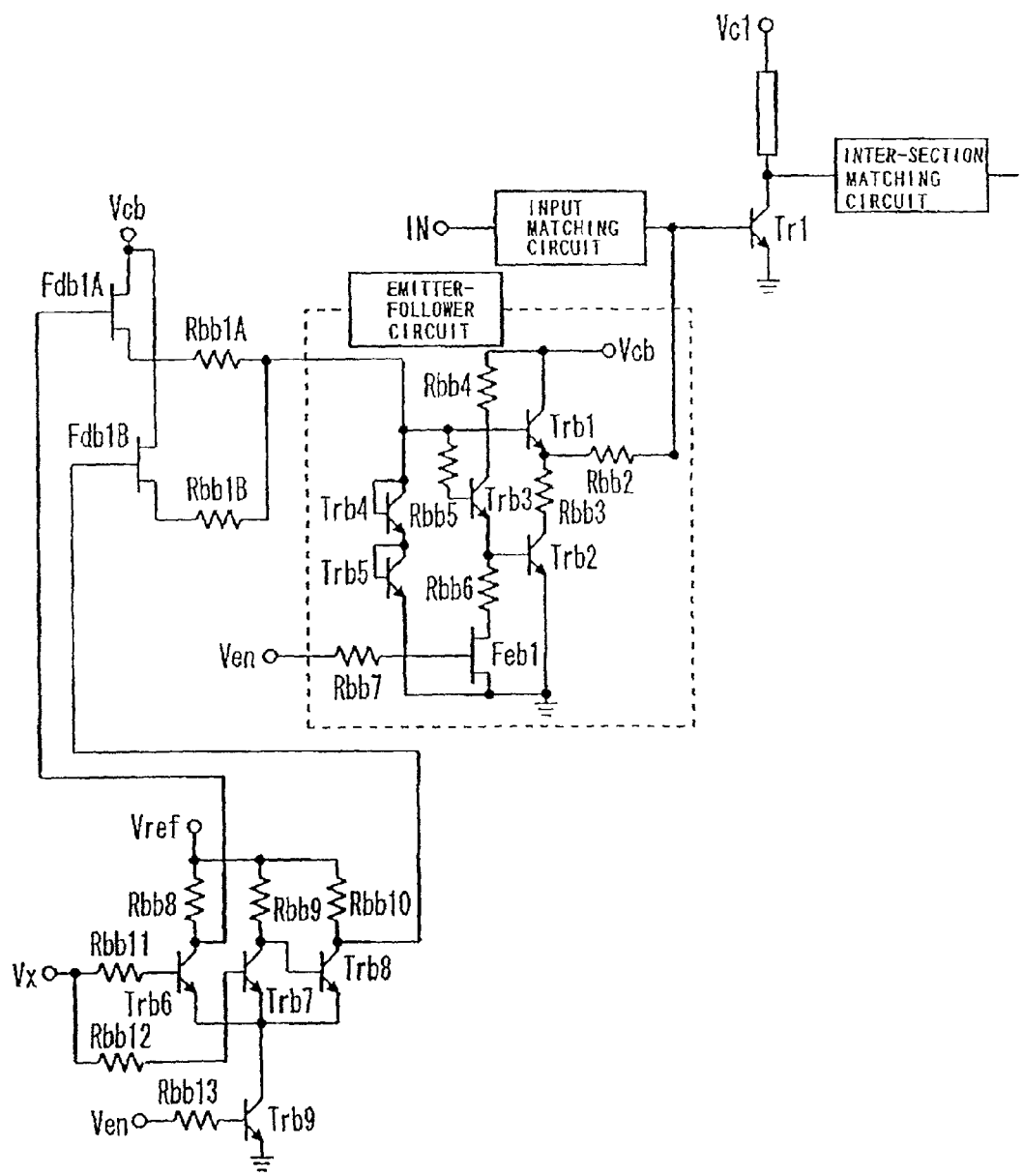
FIG. 6 is a diagram illustrating the emitter-follower type bias circuit according to Third embodiment.

FIG. 6 is a diagram illustrating the emitter-follower type bias circuit according to Third embodiment. Trb6 to Trb9 are transistors, RbbB to Rbb13 are resistors and a Vx is a terminal to which an external voltage is applied. The present embodiment corresponds to the bias circuit of Second embodiment plus a circuit that internally generates gate voltages of the Fdb1 and Fdb2 (two complementary reference voltages) from one reference voltage based on an external voltage added to the terminal Vx.

Figure 7:
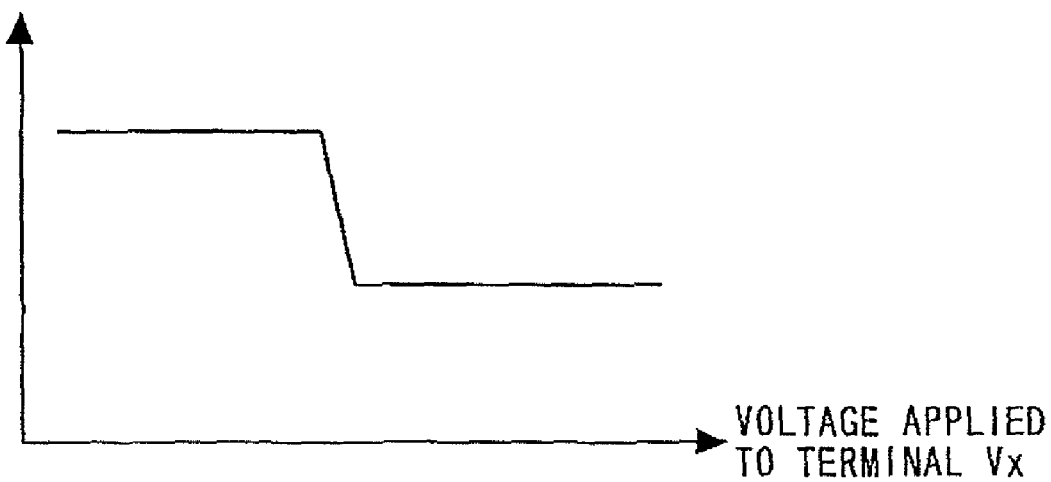
FIG. 7 is a diagram illustrating an idle current of an amplification transistor to which the bias circuit in FIG. 6 is applied.

FIG. 7 is a diagram illustrating an idle current of an amplification transistor to which the bias circuit in FIG. 6 is applied. The external voltage applied to the terminal Vx only causes the Trb6 and Trb7 to turn ON/OFF, and therefore need not be as accurate as the reference voltage. Two states of idle current can be created by only applying one voltage to the terminal Vx.

Fourth Embodiment

An emitter-follower type bias circuit according to Fourth embodiment will be described with reference to the attached drawing. Components similar to or corresponding to those in first and second embodiments will be assigned the same reference numerals and descriptions thereof will be omitted.

Figure 8:
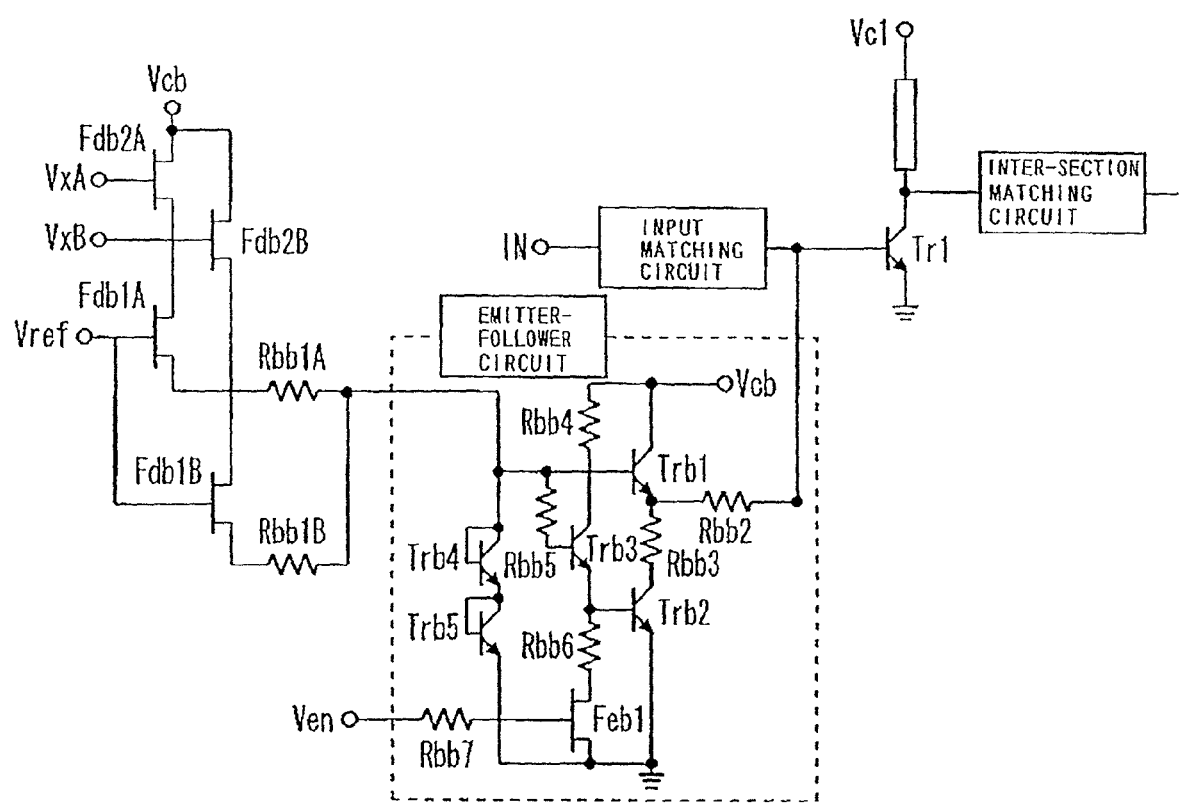
FIG. 8 is a diagram illustrating the emitter-follower type bias circuit according to Fourth embodiment.

FIG. 8 is a diagram illustrating the emitter-follower type bias circuit according to Fourth embodiment. Fdb3 and Fdb4 are depletion mode FETs and VxA and VxB are terminals to which an external voltage is applied. The present embodiment corresponds to the bias circuit of Second embodiment with Fdb2A and Fdb2B added to the drains of the Fdb1A and Fdb1B.

By applying a voltage to the terminals VxA and VxB and causing the Fdb2A and Fdb2B to turn ON/OFF, it is possible to control whether or not to operate the Fdb1A and Fdb1B respectively and select any one of Rbb1A and Rbb1B of different resistance values. The voltage applied to the terminals VxA and VxB only causes the Fdb2A and Fdb2B to turn ON/OFF and therefore need not be as accurate as the reference voltage applied to the terminals VrefA and VrefB of Second embodiment.

Fifth Embodiment

An emitter-follower type bias circuit according to Fifth embodiment will be described with reference to the attached drawing. Components similar to or corresponding to those in First embodiment will be assigned the same reference numerals and descriptions thereof will be omitted.

Figure 9:
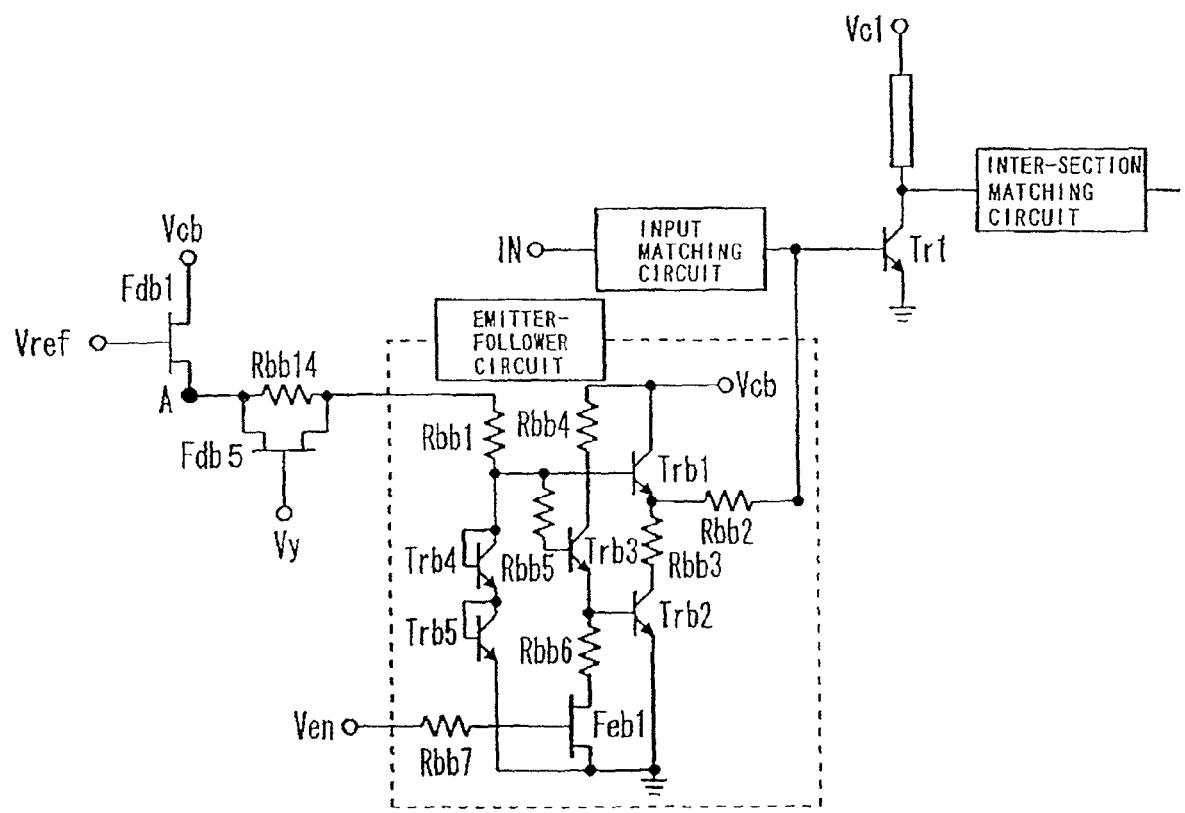
FIG. 9 is a diagram illustrating the emitter-follower type bias circuit according to Fifth embodiment.

FIG. 9 is a diagram illustrating the emitter-follower type bias circuit according to Fifth embodiment. An Fdb5 is a depletion mode FET, an Rbb14 is a resistor and a Vy is an external power supply. The present embodiment corresponds to the bias circuit of First embodiment plus a function capable of turning ON/OFF the bias circuit using the external power supply Vy.

The Fdb5 is a switch for controlling whether or not to connect the Fdb1 and the emitter-follower circuit according to an external voltage. When the Fdb5 is ON, a reference voltage is supplied to the emitter-follower circuit but no reference voltage is supplied when the Fdb5 is OFF. Therefore, it is possible to turn ON/OFF the idle current of the Tr1. As described in First embodiment, since the voltage at point A is on the order of 2.8 V, the external voltage necessary to turn ON the Fdb5 is on the order of 2.8 V.

Six Embodiment

An emitter-follower type bias circuit according to Six embodiment will be described with reference to the attached drawing. Components similar to or corresponding to those in First embodiment will be assigned the same reference numerals and descriptions thereof will be omitted.

Figure 10:
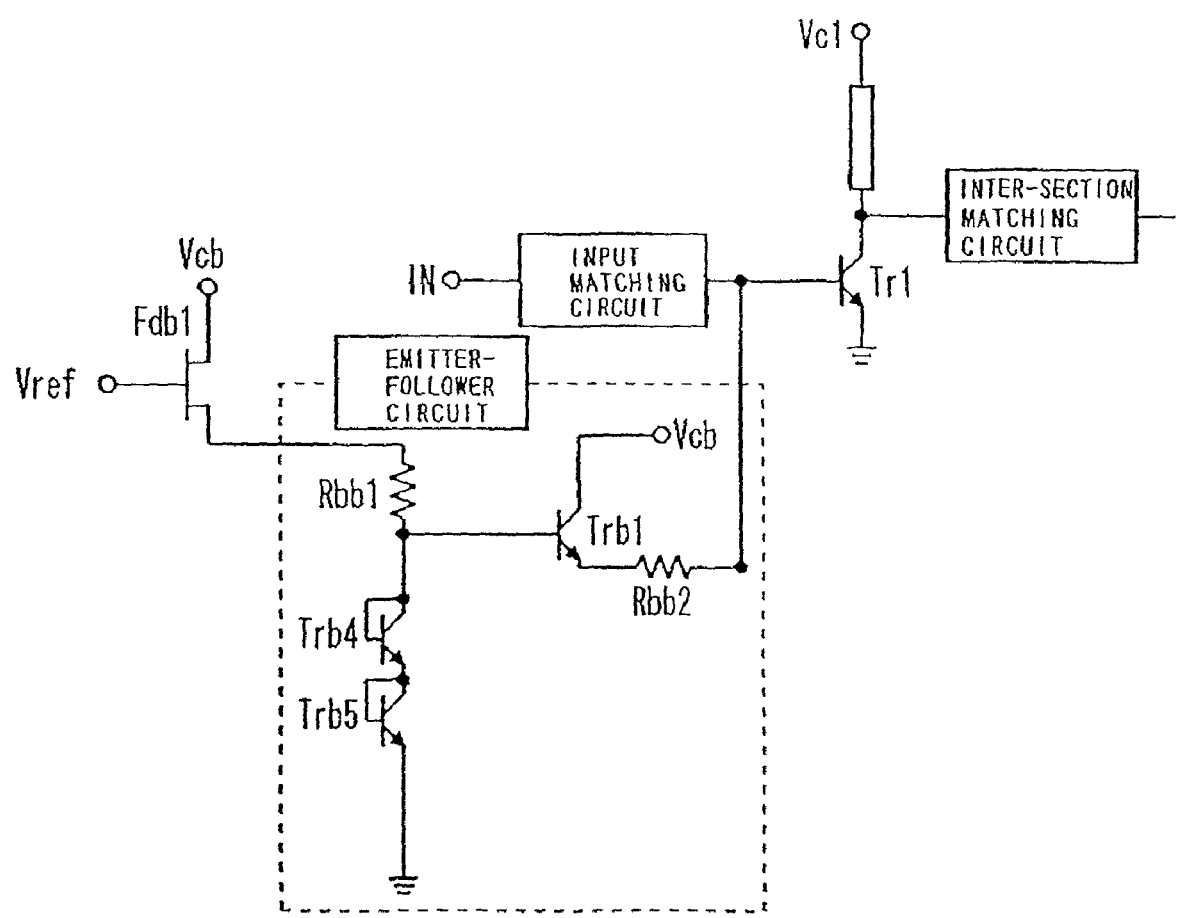
FIG. 10 is a diagram illustrating the emitter-follower type bias circuit according to Six embodiment.

FIG. 10 is a diagram illustrating the emitter-follower type bias circuit according to Six embodiment. The present embodiment corresponds to the emitter-follower circuit of First embodiment with the Trb2, Trb3, Rbb3 to Rbb7 and Feb1 removed. These removed parts play a role of reducing a temperature variation of the idle current. Therefore, the temperature variation of the idle current increases in the present embodiment, but since the number of components of the bias circuit is drastically reduced, the chip size can be reduced. Furthermore, since no enhancement mode FET is used, it is possible to reduce an idle current variation caused by a manufacturing variation of the enhancement mode FET.

Seventh Embodiment

An emitter-follower type bias circuit according to Seventh embodiment will be described with reference to the attached drawing. Components similar to or corresponding to those in First embodiment will be assigned the same reference numerals and descriptions thereof will be omitted.

Figure 11:
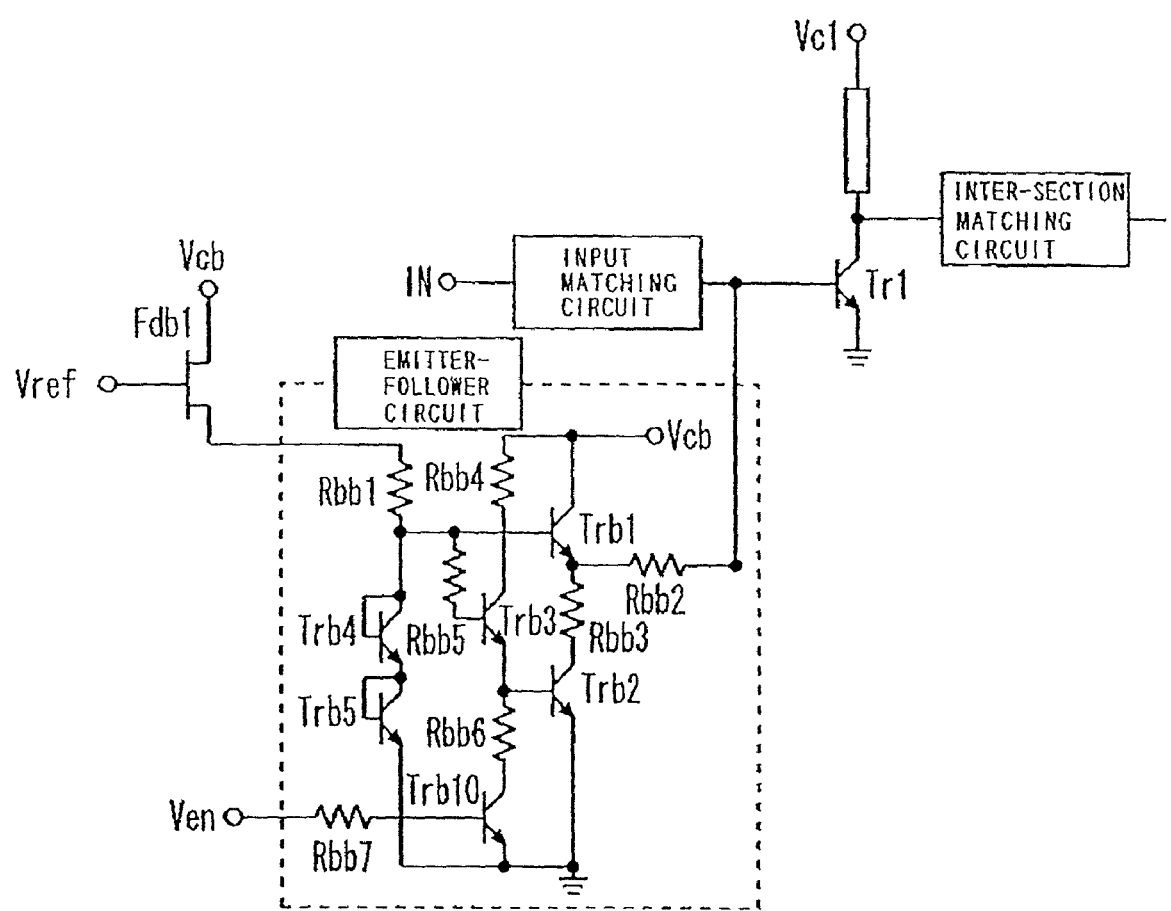
FIG. 11 is a diagram illustrating the emitter-follower type bias circuit according to Seventh embodiment.

FIG. 11 is a diagram illustrating the emitter-follower type bias circuit according to Seventh embodiment. A Trb10 is a transistor. The present embodiment corresponds to the bias circuit of First embodiment with the Feb1 replaced by the Trb10.

The Trb10 suppresses a leakage current as in the case of the Feb1 of First embodiment. Since the bias circuit can be configured without using any enhancement mode FET, it is possible to suppress manufacturing variations or costs caused by the enhancement mode FET.

Eighth Embodiment

An emitter-follower type bias circuit according to Eighth embodiment will be described with reference to the attached drawing. Components similar to or corresponding to those in First embodiment will be assigned the same reference numerals and descriptions thereof will be omitted.

Figure 12:
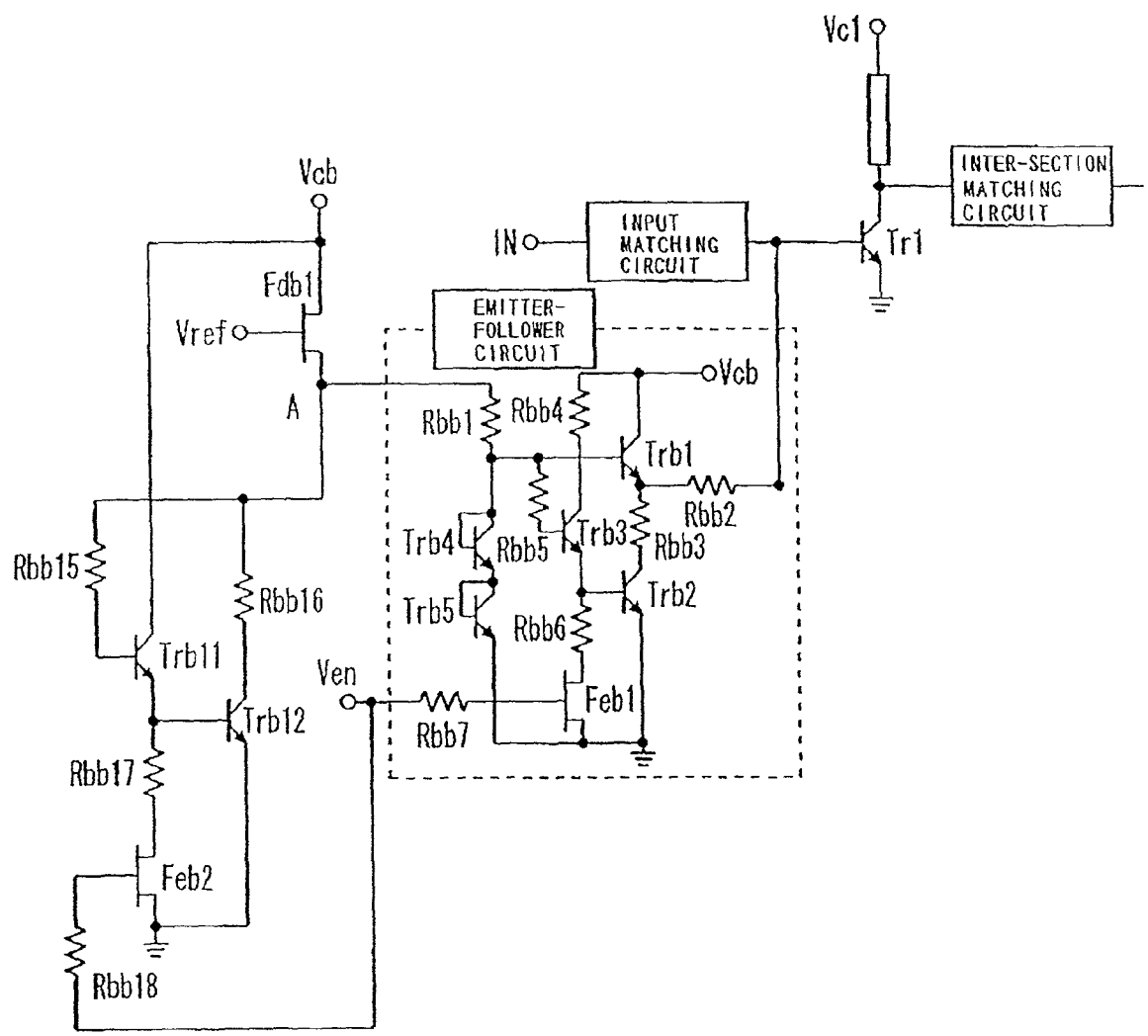
FIG. 12 is a diagram illustrating the emitter-follower type bias circuit according to Eighth embodiment.

FIG. 12 is a diagram illustrating the emitter-follower type bias circuit according to Eighth embodiment. Trb11 and Trb12 are transistors, Rbb15 to Rbb18 are resistors and Feb2 is an enhancement mode FET.

The collector of the Trb11 is connected to the power supply terminal Vcb. The base of the Trb11 is connected to the output terminal of the Fdb1 via Rbb15. The collector of the Trb12 is connected to the output terminal of the Fdb1 via the Rbb16. The base of the Trb12 is connected to the emitter of the Trb11. The emitter of the Trb12 is grounded. The drain of the Feb2 is connected to the emitter of the Trb11 via the Rbb17, the gate is connected to the terminal Ven via the Rbb18 and the source is grounded.

When the voltage at point A increases, the base voltage of the Trb11 increases, and therefore the collector current of the Trb11 increases. Therefore, since the base voltage of the Trb12 increases, the collector current of the Trb12 increases. Furthermore, since the collector of the Trb12 is connected to point A via the resistor Rbb16, the drain current of the Fdb1 increases and the source voltage of the Fdb1 (voltage at point A) decreases.

Since the circuit added in the present embodiment provides feedback for a voltage variation at point A, it is possible to reduce variations of idle current irrespective of any variation in the reference voltage and threshold voltage of the Fdb1 or the like.

Ninth Embodiment

An emitter-follower type bias circuit according to Ninth embodiment will be described with reference to the attached drawing. Components similar to or corresponding to those in first and eighth embodiments will be assigned the same reference numerals and descriptions thereof will be omitted.

Figure 13:
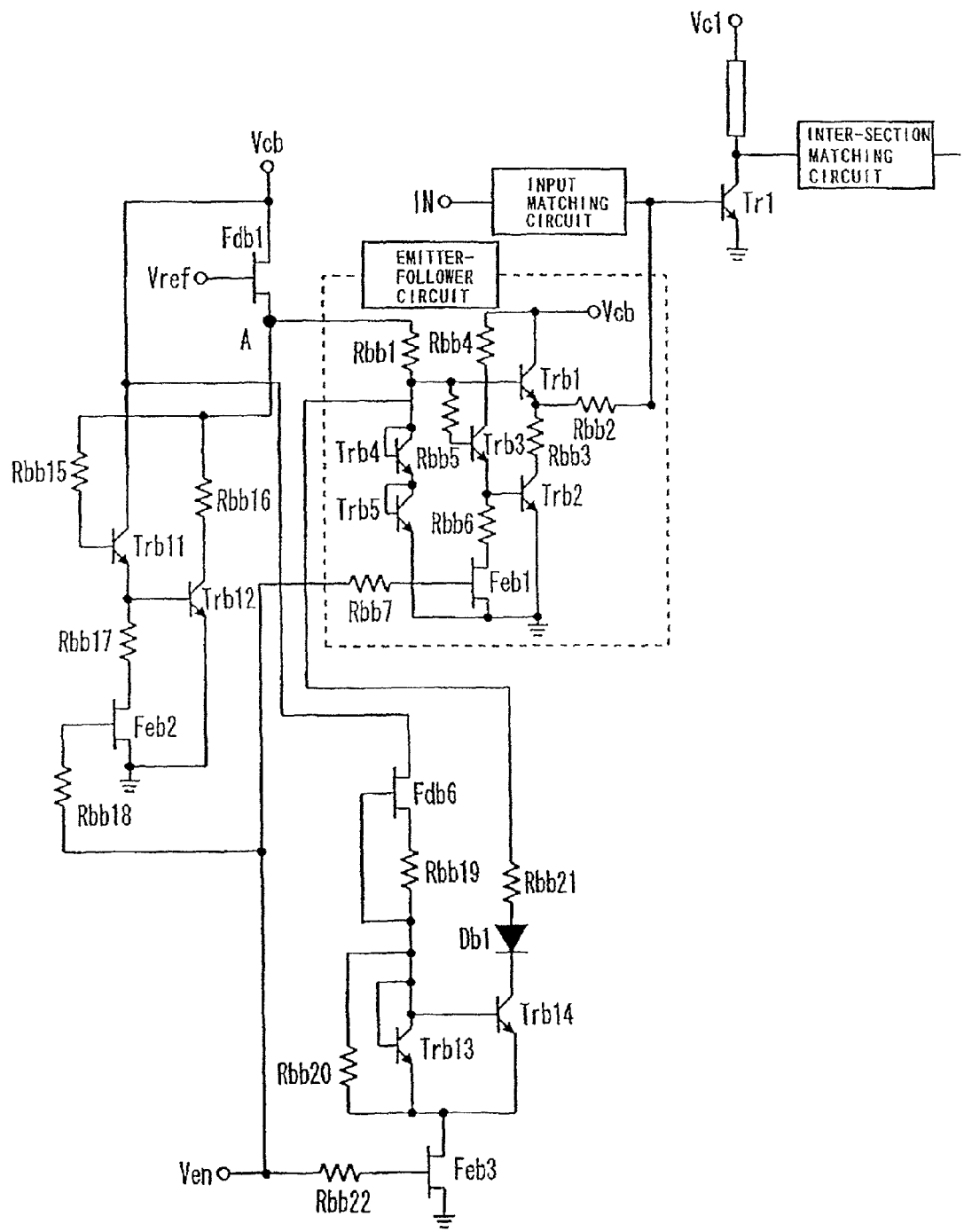
FIG. 13 is a diagram illustrating the emitter-follower type bias circuit according to Ninth embodiment.

FIG. 13 is a diagram illustrating the emitter-follower type bias circuit according to Ninth embodiment. Trb13 and Trb14 are transistors, an Fdb6 is a depletion mode FET, an Feb3 is an enhancement mode FET, Rbb19 to Rbb22 are resistors and a Db1 is a Schottky barrier diode.

The drain of the Fdb6 is connected to the power supply terminal Vcb, the gate and source of the Fdb6 are mutually connected via the Rbb19. The collector and base of the Trb13 are connected to the source of the Fdb6 and the emitter is grounded via the Feb3. The Rbb20 is connected between the collector and the emitter of the Trb13.

The collector of the Trb14 is connected to the output terminal of the Fdb1 via the Rbb1, Rbb21 and Db1. The base of the Trb14 is connected to the base of the Trb13 and the emitter is grounded via the Feb3. The gate of the Feb3 is connected to the terminal Ven via the Rbb22.

When a threshold voltage of the depletion mode FET deepens, the output voltage of the Fdb1 increases, but at the same time the drain current of the Fdb6 also increases. Therefore, the collector current of the Trb13 also increases. Furthermore, since the base of the Trb14 is connected to the base of the Trb13, the collector current of the Trb14 also increases. Accordingly, the voltage effect at the Rbb1 increases and the base voltage of the Trb1 decreases. Thus, the idle current of the Tr1 decreases.

Since the circuit added in the present embodiment functions in the direction of canceling a variation of the idle current against a variation in the threshold voltage of the depletion mode FET, it is possible to reduce an idle current variation due to a manufacturing variation in the threshold voltage.

Tenth Embodiment

An emitter-follower type bias circuit and a reference voltage generation circuit according to Tenth embodiment will be described with reference to the attached drawings. Components similar to or corresponding to those in First embodiment will be assigned the same reference numerals and descriptions thereof will be omitted.

Figure 14:
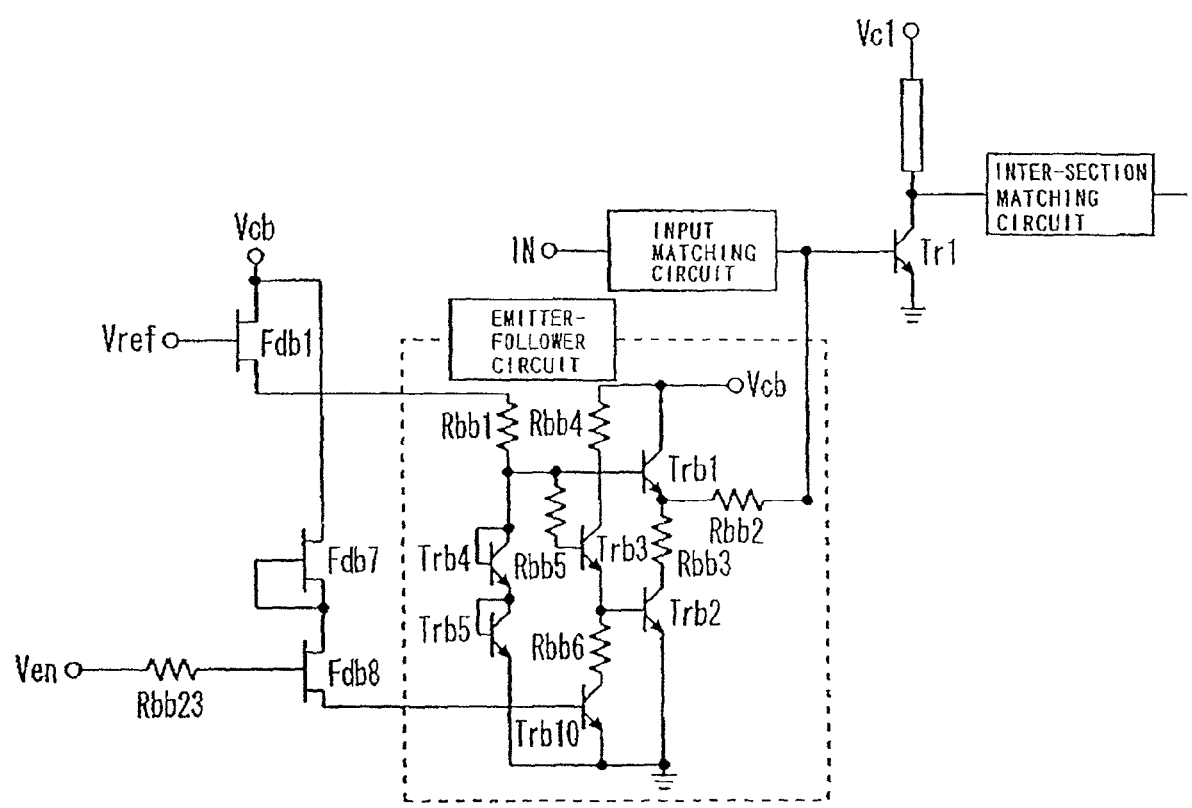
FIG. 14 is a diagram illustrating the emitter-follower type bias circuit according to Tenth embodiment.

FIG. 14 is a diagram illustrating the emitter-follower type bias circuit according to Tenth embodiment. Fdb7 and Fdb8 are depletion mode FETs and an Rbb23 is a resistor. The drain of the Fdb7 is connected to the power supply terminal Vcb. The drain of the Fdb8 is connected to the gate and source of the Fdb7. The gate of the Fdb8 is connected to the terminal Ven via the Rbb23 and the source of the Fdb8 is connected to the base of the Trb10. The circuit added in the present embodiment is a level shift circuit for an enable voltage. This allows the circuit to operate at a lower enable voltage than the threshold voltage of the Trb10.

Figure 15:
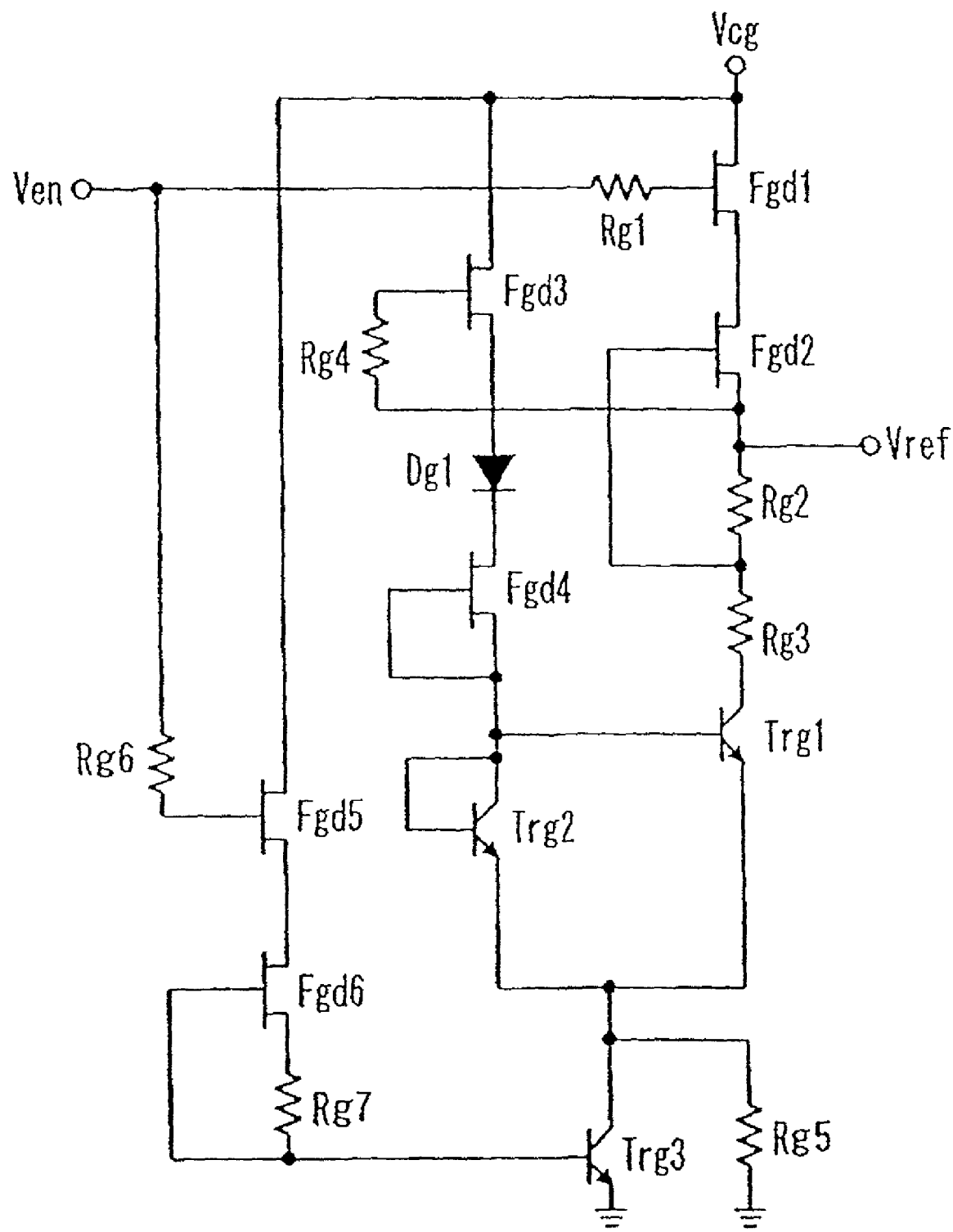
FIG. 15 is a diagram illustrating a reference voltage generation circuit according to Tenth embodiment.

FIG. 15 is a diagram illustrating a reference voltage generation circuit according to Tenth embodiment. Fgd4 to Fgd6 are depletion mode FETs, Trg1 to Trg3 are transistors and Rg5 to Rg7 are resistors. The Trg3 functions to suppress a leakage current as in the case of the Trb13 of Ninth embodiment. The Fgd5 is disposed between the terminal Ven and the base of the Trg3 so as to be able to operate at a low enable voltage as in the case of the Fdb8 in FIG. 14.

Although the circuit scale is larger than First embodiment, the reference voltage generation circuit according to the present embodiment has a circuit configuration without using any enhancement mode FET. Therefore, with the power amplifier incorporating the reference voltage generation circuit, it is possible to suppress any manufacturing variation and manufacturing cost caused by the enhancement mode FET.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-021073, filed on Feb. 2, 2010 including specification, claims, drawings and summary, on which the Convention priority of the present application is based, are incorporated herein by reference in its entirety.

What is claimed is:

1. An emitter-follower bias circuit supplying a bias voltage to a base of an amplification transistor, the emitter-follower bias circuit comprising:
   a depletion mode FET boosting a reference voltage;
   an emitter-follower circuit generating the bias voltage in response to the reference voltage boosted by the depletion mode FET; and
   first and second resistors having different resistance values, wherein
      the reference voltage includes complementary first and second reference voltages,
      the depletion mode FET includes a first depletion mode FET boosting the first reference voltage, and a second depletion mode FET boosting the second reference voltage, the first reference voltage boosted by the first depletion mode FET is input to the emitter-follower circuit via the first resistor, and the second reference voltage boosted by the second depletion mode FET is input to the emitter-follower circuit via the second resistor.

2. The emitter-follower bias circuit according to claim 1, further comprising a circuit that internally generates the first and second reference voltages from one reference voltage based on an external voltage.

3. An emitter-follower bias circuit supplying a bias voltage to a base of an amplification transistor, the emitter-follower bias circuit comprising:
   a depletion mode FET boosting a reference voltage;
   an emitter-follower circuit generating the bias voltage in response to the reference voltage boosted by the depletion mode FET;
   first and second resistors having different resistance values; and
   first and second switches turning ON/OFF according to an external voltage, wherein
      the depletion mode FET includes first and second depletion mode FETs,
      the first and second switches control whether to operate the first and second depletion mode FETs, respectively,
      the reference voltage boosted by the first depletion mode FET is input to the emitter-follower circuit via the first resistor, and
      the reference voltage boosted by the second depletion mode FET is input to the emitter-follower circuit via the second resistor.

4. An emitter-follower bias circuit supplying a bias voltage to a base of an amplification transistor, the emitter-follower bias circuit comprising:
   a depletion mode FET boosting a reference voltage;
   an emitter-follower circuit generating the bias voltage in response to the reference voltage boosted by the depletion mode FET; and
   a switch controlling connection of the depletion mode FET and the emitter-follower circuit in response to an external voltage.

5. An emitter-follower bias circuit supplying a bias voltage to a base of an amplification transistor, the emitter-follower circuit comprising:
   a depletion mode FET boosting a reference voltage;
   an emitter-follower circuit generating the bias voltage in response to the reference voltage boosted by the depletion mode FET;
   a first transistor having a collector connected to a power supply, a base connected to an output terminal of the depletion mode FET, and an emitter; and
   a second transistor having a collector connected to the output terminal of the depletion mode FET via a resistor, a base connected to the emitter of the first transistor, and an emitter that is grounded.

6. An emitter-follower bias circuit supplying a bias voltage to a base of an amplification transistor, the emitter-follower bias circuit comprising:
   a depletion mode FET boosting a reference voltage;
   an emitter-follower circuit generating the bias voltage in response to the reference voltage boosted by the depletion mode FET;
   a second depletion mode FET having a gate and a source which are mutually connected, and a drain connected to a power supply;
   a first transistor having a collector and a base which are connected to the source of the second depletion mode FET, and an emitter that is grounded; and
   a second transistor having a collector connected to an output terminal of the depletion mode FET via a resistor, a base connected to the base of the first transistor, and an emitter that is grounded.

* * * * *